United States Patent [19]

Mindler

[11] Patent Number: 5,336,348
[45] Date of Patent: Aug. 9, 1994

[54] METHOD FOR FORMING A VERMICULITE FILM

[75] Inventor: Richard E. Mindler, Quakertown, Pa.

[73] Assignee: W. R. Grace & Co.-Conn., New York, N.Y.

[21] Appl. No.: 991,656

[22] Filed: Dec. 16, 1992

[51] Int. Cl.$^5$ ............... B28B 23/00; C04B 41/28; B32B 1/00

[52] U.S. Cl. .................. 156/231; 156/247; 156/249; 156/235; 428/357; 428/288; 428/365; 428/921; 106/675; 106/DIG. 3

[58] Field of Search ............ 156/231, 234, 235, 247, 156/249, 284, 395, 305, 540; 106/675, DIG. 3; 428/288, 365, 357, 921

[56] References Cited

U.S. PATENT DOCUMENTS

| | | | |
|---|---|---|---|
| 3,325,340 | 6/1967 | Walker | 161/168 |
| 3,390,045 | 1/1968 | Miller et al. | 162/3 |
| 3,434,917 | 3/1969 | Kraus et al. | 162/3 |
| 3,466,222 | 9/1969 | Curtis | 161/160 X |
| 3,770,569 | 11/1973 | Breiner | 156/308.2 X |
| 3,906,061 | 9/1975 | Boyer | 260/928 |
| 3,916,057 | 10/1975 | Hatch | 156/60 X |
| 3,934,066 | 1/1976 | Murch | 428/248 X |
| 4,130,687 | 12/1978 | Ballard | 428/310 X |
| 4,239,519 | 12/1980 | Beall et al. | 65/2 |
| 4,269,628 | 5/1981 | Ballard et al. | 106/86 |
| 4,271,228 | 6/1981 | Foster | 428/281 X |
| 4,324,838 | 4/1982 | Ballard et al. | 428/402 |
| 4,366,204 | 12/1982 | Briggs | 428/318.4 |
| 4,416,043 | 11/1983 | Aoki et al. | 29/132 |
| 4,425,465 | 1/1984 | Padget et al. | 524/450 |
| 4,433,020 | 2/1984 | Narukawa | 428/288 X |
| 4,450,022 | 5/1984 | Galer | 156/42 X |
| 4,472,478 | 9/1984 | Briggs | 428/283 |
| 4,485,203 | 11/1984 | Hutchinson | 524/414 X |
| 4,539,046 | 9/1985 | McAloon et al. | 106/121 |
| 4,608,303 | 5/1986 | Ballard | 428/357 X |
| 4,618,528 | 10/1986 | Sacks et al. | 428/216 |
| 4,707,298 | 11/1987 | Tymon | 252/378 R |
| 4,746,570 | 5/1988 | Suzaki | 428/327 |
| 4,775,586 | 10/1988 | Bohrn et al. | 428/324 |
| 4,800,041 | 1/1989 | Tymon et al. | 252/378 R |
| 4,801,403 | 1/1989 | Lu et al. | 252/378 R |
| 4,818,435 | 4/1989 | Lukacs, III | 252/378 R |
| 4,818,595 | 4/1989 | Ellis | 428/245 X |
| 4,851,021 | 7/1989 | Bohrn et al. | 65/17 |
| 4,877,551 | 10/1989 | Lukacs, III | 252/378 R X |
| 4,923,729 | 5/1990 | Porter | 428/71 X |
| 4,965,031 | 10/1990 | Conroy | 264/122 X |
| 5,051,475 | 9/1991 | Tsunashima | 525/175 X |
| 5,098,504 | 3/1992 | Motoki | 156/305 X |
| 5,112,683 | 5/1992 | Johansen | 428/354 X |
| 5,130,184 | 7/1992 | Ellis | 428/245 X |
| 5,167,764 | 12/1992 | Nielsen | 428/288 X |

FOREIGN PATENT DOCUMENTS 441996 8/1991 European Pat. Off. .

OTHER PUBLICATIONS

"Preliminary Data Sheet; Vermiculite Dispersions" Speciality Vermiculite Technical Bulletin, W. R. Grace & Co., May 1, 1985 (2 pages).
BF Goodrich Chemical Company, Chemical Group, "Technical Data Geon 577" (1 page).
BF Goodrich Company, Chemical Group, "Temporary Product Specification Geon 352X21 Latex" (1 page).

*Primary Examiner*—David A. Simmons
*Assistant Examiner*—Charles Rainwater
*Attorney, Agent, or Firm*—Craig K. Leon; William L. Baker

[57] ABSTRACT

The present invention provides a method for forming a coherent vermiculite film which can be performed on a continuous basis. An exemplary method comprises the steps of providing a non-flocculated dispersion of delaminated vermiculite platelets, providing a flexible release carrier having a surface operative for retaining thereupon a wet film of said dispersion and further operative for releasing the vermiculite film when dried, applying a wet vermiculite film to the moving carrier, and drying the vermiculite film, whereby the dried film is releasable from the carrier. The flexible release carrier preferably comprises paper having a release agent coating thereon. The invention also provides a flexible carrier-supported releasable vermiculite film, a film made from an vermiculite-aziridine composition, a composition of vermiculite and an aziridine, and a composition of vermiculite and amine resulting from an aziridine.

21 Claims, 3 Drawing Sheets

METHOD FOR FORMING A VERMICULITE FILM

FIELD OF THE INVENTION

The present invention relates to the production of vermiculite materials, and more particularly to a flexible-carrier-supported releasable vermiculite film and method for forming a vermiculite film.

BACKGROUND OF THE INVENTION

It is known that granules of vermiculite, a common naturally occurring micaceous mineral, may be swollen or expanded many-fold by the action of aqueous salts. Thereafter, the "exfoliated" structures are delaminated by shearing to yield thin platelets termed "vermiculite lamellae." These thin platelets have unique surface charge characteristics. The platelet surface is mostly anionic with localized positive charge at the edge of the particle. The platelets also have high aspect ratios (e.g., diameter:thickness). These properties facilitate the formation of vermiculite papers/films, laminates, coatings, foams, and articles, such as gaskets, which have heat resistance and flame-retardant properties.

U.S. Pat. No. 3,434,917 of Kraus et al., incorporated herein by reference, disclosed a process for preparing sheets. A suspension of vermiculite platelets is first prepared by immersing vermiculite ore in sodium chloride and lithium chloride solutions, rinsing it with water and swelling it, and then shearing it through vigorous agitation of the suspension. Particle size may be further reduced by use of a colloid mill. After adjustment of platelet concentration in the water medium, a flocculation agent, such as potassium hydroxide, hydrochloric acid, various inorganic salts, mineral acids or bases, or the like, is added to aggregate the platelets into a pulp-like mass. The pulp is deposited onto a screen to form a paper mat. Other materials such as clays, cellulose fibers, and polymeric fibers can be added to the suspension prior to flocculation for improving strength and tear resistance. Kraus also teaches a method for forming wet-laid vermiculite paper from a flocculated vermiculite dispersion.

European Patent Application 0,441,996 A1 of Hercules, Inc., published Aug. 21, 1991, disclosed a composite sheet made from a flocculated mixture of mechanically delaminated vermiculite, either glass or paper fibers, and at least one flocculating agent to flocculate the dispersion. The flocculated mixture may be used to form paper handsheets on conventional papermaking screens (e.g., 100 mesh screens) or continuous paper rolls using a 12-inch (30.5 cm) wide flat wire Fourdrinier paper machine.

In U.S. Pat. Nos. 4,269,628 and 4,324,838, incorporated herein by reference, Ballard et al. disclosed that vermiculite sheets could be made by casting an aqueous paste or slurry containing vermiculite and water stability additives such as magnesium oxide or calcium oxide. These patents stated that laminates of either vermiculite sheet or foam can be formed continuously by extruding an aqueous paste or slurry of the vermiculite composition onto a porous mesh carrier belt, and drying the vermiculite with hot air. Thereafter, an isocyanate-based foam mix can be deposited onto the vermiculite; or the vermiculite/carrier could be fed through a laminator as a bottom facing or center core in the formation of a laminate product.

Vermiculite sheet material is typically formed as a laminate, a thick paper mat, or frequently with cellulose or polymeric fibers for structural support. The present invention, on the other hand, is directed to a method for making a "film" rather than a "paper." The term "film" has often been used synonomously to refer to a thin "paper" even though, as a technical matter, paper is made by screening out a sedimented fiber or pulp such as flocced or aggregated vermiculite. In the present invention, however, the term "film" is used to refer to a vermiculite sheet formed by evaporating water from a nonflocculated colloidal dispersion of delaminated vermiculite platelets. The film is therefore a coherent sheet of vermiculite lamellae that has no substantial discontinuities such as would occur in aggregated or fiber-intertwined paper, which has discontinuities between and among fibers or aggregated particles.

It is known that a vermiculite dispersion can be deposited onto a polished granite table or glass surface and removed as a film. The procedure is slow and labor-intensive because water must be evaporated to dry the wet film, and care must be taken during removal to avoid tearing of the dried film. The inventor has discovered that drying by heat or hot air usually causes a "skin" to form on the film surface which traps moisture that is attempting to evaporate from the vermiculite dispersion. Consequently, bubbles or "blisters" tend to arise and rupture, destroying the coherence of the film. This phenomenon, hereinafter referred to as "blistering," is believed to have precluded the possibility of continuously forming a coherent vermiculite film.

Wire mesh, called the fourdrinier, is used in the paper-making arts for continuously forming paper. The paper is formed when fibers interlock and sufficient water is removed through the pores in the screen to allow the paper sheet to hold together. However, such a carrier is inappropriate for forming a vermiculite film. Vermiculite could fall through the mesh if not flocculated or aggregated first into a fibrous or pulped mass; or it would otherwise become embedded into the mesh and inseparable therefrom even if the vermiculite were sufficiently viscous such that it could sit on top of the mesh.

Plastic films such as polyester and mylar might be contemplated as carrier sheets, but these are difficult to work with because vermiculite dispersions do not tend to form films, especially thin ones, on plastic surfaces. The dispersion tends to "bead up" on the plastic surface. If the surface is roughened, such as by using sandpaper, the vermiculite film is not releasable.

Another problem with attempting to find a suitable carrier for vermiculite film is viscosity. If too fluid, the vermiculite dispersion tends to "bead" on the carrier and does not form a film. If too thick, the dispersion cannot be readily worked into a uniform thin film. In addition, vermiculite can only be loaded into an aqueous dispersion up to a maximum total dry weight vermiculite solids content of about 20 percent. Beyond this point, the vermiculite becomes a gel which will not spread easily.

In view of the foregoing disadvantages of the prior art, a novel method, vermiculite film/carrier, and/or vermiculite composition are needed.

SUMMARY OF THE INVENTION

In surmounting the disadvantages of the prior art, the present invention provides a novel method for forming a vermiculite film using unflocculated vermiculite dispersions or dispersion mixtures. Substantially blister-free films can be produced by wet-casting onto a flexible release carrier relatively thin vermiculite film layers which, when dry, are about 1 mil thickness or less. Preferably, the flexible release carrier comprises paper. The film release carrier must be flexible and have retentivity/releasability characteristics suitable for thin vermiculite film formation (e.g., 1 mil or less when dry). In other words, the flexible carrier must have wet film retentivity, such that a wet vermiculite film layer can be formed and dried thereon without beading or premature release; and, once the vermiculite is dried, the flexible carrier must have sufficient releasability such that the dried film can be peeled as a coherent sheet from the carrier. Preferably, the vermiculite film should be dried at temperatures which do not exceed 185°(±5°) F. to minimize the risk of blistering.

An exemplary method thus comprises the steps of providing a non-flocculated colloidal dispersion of delaminated vermiculite platelets; providing a flexible film release carrier having wet vermiculite film retentivity and dried vermiculite film releasability; and applying a wet film of said dispersion to said carrier; and allowing said film to dry on said carrier, whereby a dried vermiculite film is formed upon and releasable from said flexible film carrier. An exemplary film release carrier can be a tape backing comprised of a paper saturated and/or coated with a release agent. A number of commercially available tape backings have been found to be satisfactory for this purpose.

The invention also provides a flexible-carrier-supported releasable vermiculite film. When released from the carrier, the film is self-supportive in that it requires no laminate or reinforcement to maintain integrity.

In other exemplary methods of the invention, the dried vermiculite film and flexible release carrier are separated by peeling them apart. Further exemplary methods of the invention include the step of applying an adhesive onto the dried vermiculite film side of the film/carrier, adhering the film to a substrate such as a wall, panel, or other object, and peeling the releasable carrier from the adhered film. The formation of the vermiculite film of the present invention, as well as its separation from the flexible releasable carrier, can be done on a continuous basis.

In another exemplary method, a wet film of vermiculite, approximately 6-7 mils wet thickness, is continuously deposited onto a moving flexible carrier and allowed to dry by moving the film-covered carrier through an oven such that a dried film layer of about 1 mil thickness is continuously formed. The ability of the flexible carrier to form thin coherent vermiculite films helps to avoid blistering and facilitates drying. Films having additional thicknesses may be formed by sequential application of thin layers onto previously applied and dried vermiculite layers.

The present invention also provides a vermiculite composition comprising vermiculite lamellae and an aziridine which is a group of materials based on the ring structure

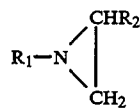

wherein $R_1$ and/or $R_2$ may include hydrogen, an alkyl group comprising one or more carbons, or a carboxyl group. $R_1$ and/or $R_2$ may also include polyfunctional groups. Exemplary methods and films of the invention employ an aziridine in the vermiculite dispersion to improve water resistance and maintain flame retardance, and flexibility if desired (e.g. for films), in the final formed product. The invention also pertains to compositions and films comprising vermiculite and an amine, which is believed to derive from an aziridine when subjected to the drying temperatures employed herein.

A considerable advantage is provided by the exemplary dry vermiculite films of the invention in that they can be adhered conveniently to objects that cannot be satisfactorily coated with wet films, as well as to fragile, extended, elongated, large, or bulky articles that by their size or nature are unsuitable for being placed into drying ovens or heated for extended periods of time.

Continuously formed vermiculite films of the invention may be used as heat-insulative layers in printed circuit applications; as continuous flame-retardant wrapping for elongated objects such as pipes, optical cables, and electrical cables; and as heat-insulative, flame retardant applications in large-scale construction products such as gypsum boards, wallpapers, veneers, aircraft structures, and fiberglass insulation backings. Further exemplary methods, films, and compositions of the invention are disclosed herein.

DETAILED DESCRIPTION OF THE INVENTION

Figure 1:
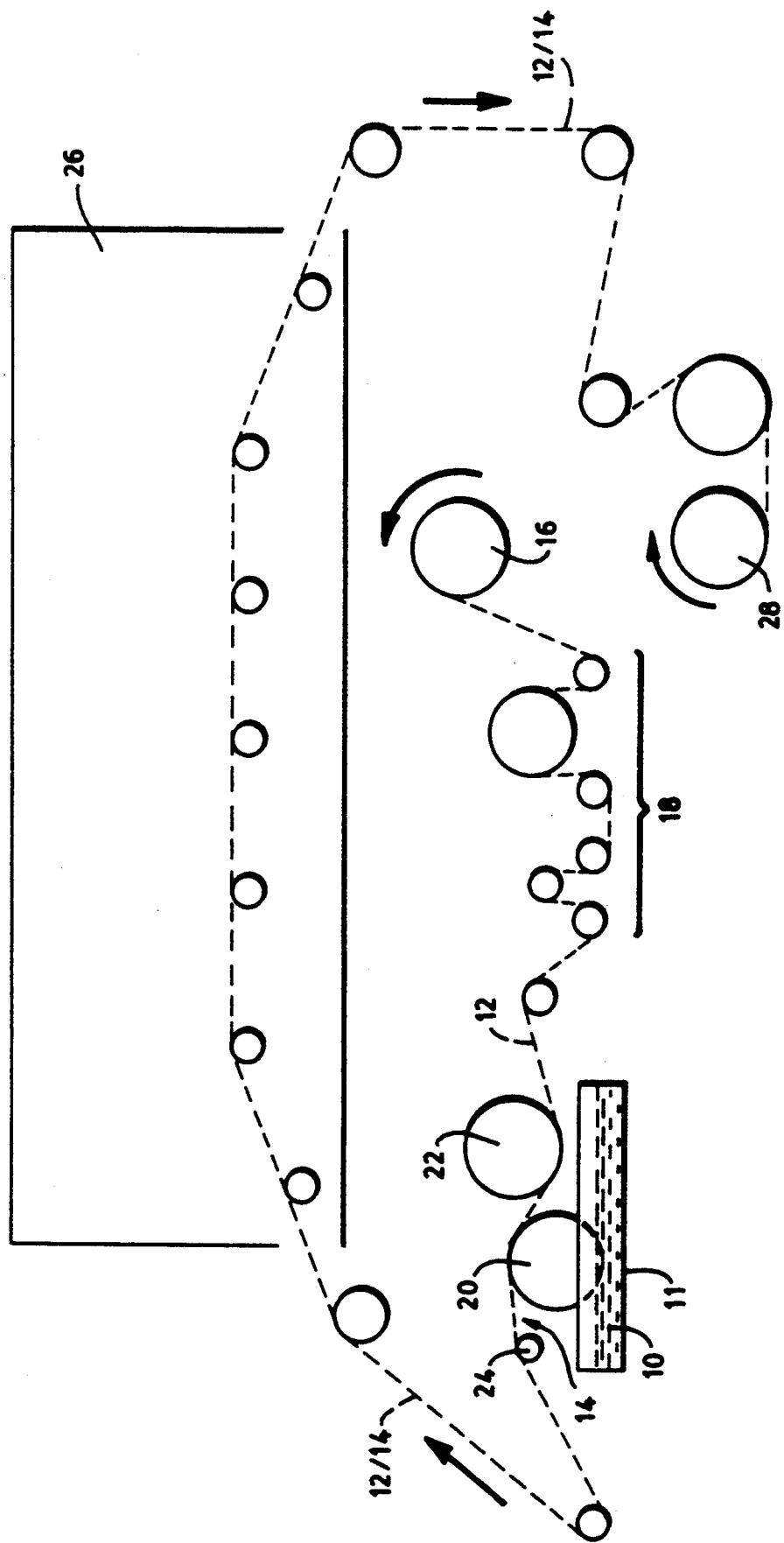
FIG. 1 is a diagrammatic illustration of an exemplary method of the invention for forming a vermiculite film.

The present invention provides a novel method for forming vermiculite film using a flexible film release carrier. As shown in FIG. 1, an exemplary method comprises the steps of providing a nonflocculated dispersion of delaminated vermiculite platelets 10; providing a flexible film release carrier 12 having a surface operative for retaining a wet film 14 of the nonflocculated vermiculite dispersion 10 (the surface thereby having "wet film retentivity"); applying a wet vermiculite film 14 on the carrier 12; allowing the vermiculite film 14 to dry; then separating the dried film 14 and release carrier 12, the flexible carrier surface being further operative to release the dried film 14 as a coherent sheet (the surface thereby having "dried film releasability").

As shown in FIG. 1, the method of forming a vermiculite film using a flexible carrier can be performed on a continuous basis. The nonflocculated vermiculite dispersion 10 is contained in a tank or tray 11 or other reservoir. The term "nonflocculated" is used herein to refer to a colloidal dispersion of delaminated vermiculite platelets that are not coagulated or aggregated. Although a range of vermiculite platelet sizes may be used, it is preferable to use vermiculite dispersions substantially comprised (e.g. at least 60%) of platelets not exceeding 50 microns in size, and more preferably not exceeding 20 microns in size. Methods for obtaining small platelets are known. Preferred vermiculite dispersions for use in the methods, films, and compositions of the present invention are commercially available from the Construction Products Division of W. R. Grace & Co.-Conn., Cambridge, Mass., under the tradename MicroLite ®. For example, MicroLite ® "HTS" has a high solids content of about 15% dry weight with 33% or less by dry weight percent of particles exceeding 45 microns, and is believed suitable for purposes of the invention. It is important to use deionized water when adjusting concentration and viscosity, or flocculation will occur.

The flexible release carrier 12 should have the ability to retain, without beading, wet vermiculite film layers of approximately 6-7 mils thickness or less at a time, which would result in a dried vermiculite film layer of approximately 1 mil or less.

The carrier should also be able to release the vermiculite film, when dried, as a coherent sheet without substantial tearing. Preferably, the wet film retentivity of the flexible carrier is such that the vermiculite is fully attached at all points to the carrier during all stages of drying, and detachment of the carrier from the film occurs only after the vermiculite film is dried, so that the risk of tearing detached film from attached film is minimized when the film and carrier are peeled apart.

As previously stated, an exemplary flexible film release carrier 12 comprises a paper. The term "paper" as used herein means and refers to a sheet-like material that is formed of fibers, typically cellulosic in nature. Because interstices, gaps, or openings exist between the fibers, the paper may require being saturated and/or coated to prevent vermiculite from sinking or "biting" too deeply into the paper such that releasability of a dried vermiculite film is prevented. A material for coating the paper (i.e. bridging the interstices) may comprise a material such as a natural and/or synthetic latex. In exemplary methods of the invention, it may be preferable to saturate the paper first with a material such as latex prior to applying one or more latex coatings, and to press roll or calender the paper after saturation and/or coating. More than one coating may be required depending on the density, smoothness, and/or fiber characteristics of the paper.

If a particular paper does not provide satisfactory releasability, in that dried vermiculite film is hard to separate without tearing or does not separate at all, it is believed that the vermiculite may be sinking too deeply into the paper. Therefore, it is preferable to pretreat the paper either by saturating it first with a material such as a latex, or by press-rolling (i.e. running paper between steel cylinder and fabric covered roller) or preferably by calendering the paper one or more times (i.e. using two steel cylinders having about 500–2000 pounds per lineal inch of nip) prior to coating the paper with one or more coatings of latex material. The smoothness of a suitable exemplary vermiculite-ready carrier is believed to be about 350 Sheffield Engineering Units, although this figure may not necessarily be significant since the efficacy of the paper as a carrier may well depend on the size of platelets or viscosity characteristics of the dispersion.

The paper carrier may also be prepared without coating or saturation, such as by calendering it four to six times at 1,000 pounds per lineal inch of nip or more, prior to coating with a release agent; but this is less preferred.

An exemplary paper-based carrier of the invention may be prepared as follows. A suitable paper is a flat saturating grade paper, semi-bleached, made from Northern Softwood Kraft, 50 lbs. per ream. This paper may be saturated by immersing it in a latex mixture comprising, by percentage weight based on total weight dry solids, the following: acrylonitrile butadiene styrene (49.2%) available from BASF under the tradename Butofan ® NS-248; carboxylated styrene butadiene (49.2%) available from Reichhold Chemical under the tradename Tylac ® 68321-00; a chelating agent comprised of ethylenediaminetetraacetic tetrasodium salt (EDTA) (0.5%) available from W. R. Grace & Co.-Conn. under the tradename Hamp-ene ® 100; melamine formaldehyde resin (1%) available from American Cyanamid under the tradename Cymel ® 301; and a catalyst comprised of paratoluene sulfonic acid (PTSA)(0.1%) available from American Cyanamid under the tradename Catalyst 1010.

The paper is removed from the saturant and lightly squeezed between the nips of steel cylinders such that not all of the saturant is squeezed out and the paper remains moist to the touch. The moist paper is dried at a temperature of approximately 300° F. The saturated paper is then coated by laying a coating of the above-described latex mixture on the surface by an applicator roll, then excess coating is removed by an air knife at 3 lbs air pressure. Then the coated/saturated paper is dried at 400° F. Preferably, the coating process is repeated once more to impart further smoothness to the textured surface of the paper. A suitable commercially coated/saturated paper suitable for use in the present invention is Endura ® PRT ™ (Product No. 24021) (which is coated with a stearyl-containing release agent), available from Endura, a unit of W. R. Grace & Co.-Conn., located in Quakertown, Pa. This paper has been sold as a tape backing.

In further exemplary carriers 12, a release agent is preferably coated onto the paper surface of the carrier to improve dried vermiculite film releasability without defeating wettability (i.e. wet film retentivity). See Endura ® PRT ™ mentioned above. A suitable release agent is an acrylonitrile acrylic copolymer available from W. R. Grace & Co.-Conn., Organic Chemical Division, Owensboro, Ky., under the tradename DAREX ® 409L. This release agent may be used with the prepared Kraft paper as described above.

A number of paper tape backings, which are commercially sold to tape manufacturers who apply adhesive to make a finished adhesive tape product, have been discovered by the inventor to provide satisfactory results when used as an exemplary paper-based release carrier in the present invention. One such paper tape backing, believed to be covered with a silicone-based release agent coating, is available from Avery Fasson Dennison, Inc. of Painesville, Ohio, under the tradename "1115 Tape." Another paper-based tape backing, also believed to have a silicone-based release agent coating, is available from Specialty Tapes of Racine, Wis., under the designation "ST 5901." A release agent coating, believed to be a carbamate functional polymer, suitable for use on exemplary paper-based carriers of the invention, is available from Anderson Development Company of Anderson, Mich., under the tradename Escoat ™ P-20.

Other release agents suitable for use on exemplary paper-based carriers of the invention may comprise a surfactant, wax, silicone, paraffin, oil, resin, polymer (e.g., polyethylene, polyester) or other abherent material, or combinations of the foregoing. Release agents may be incorporated directly into the vermiculite dispersion, so long as flocculation does not occur, but this is not preferred. The paper used (such as Northern Softwood Kraft, 50 lbs per ream) is preferably calendered two to five times at 500–2000 lbs per lineal inch of nip prior to coating with the release agent.

A preferred method of the invention provides a method for wet-casting and forming a vermiculite film on a continuous basis. In the embodiment shown in FIG. 1, the carrier 12 is continuously unrolled from an unwind roller 16. Known tensioning units, designated as at 18, are used to prevent slippage. Thereafter, the carrier 12 is moved to a pick-up or kiss roller 20. The kiss roller 20 is a steel cylinder that picks up by contact a wet film 14 comprised of vermiculite dispersion 10 from the tray 11 and administers it to a surface of the moving flexible carrier 12.

A guide roll 22 is preferably used for guiding the carrier 12 across the kiss roller 20 and for adjusting the movement and/or tension of the carrier. A wet film is applied to the underside of the carrier 12 then drawn across a #56 Meyer rod 24. A Meyer rod is a ¼ to ½ inch diameter stainless steel drill rod stock individually spirally wrapped with various gauges of stainless steel wire. Between each wrap (turn of wire) is a "V"-groove shape: as wire gauge increases, the size of the groove becomes larger, thus allowing a thicker layer of the vermiculite dispersion to be defined on the carrier surface. A #56 Meyer rod, for example, ensures that a fairly uniform wet vermiculite film of approximately 6–8 mils can be wet cast onto the carrier; this results in a dried film thickness of about 1 mil. The wet film-covered carrier 12/14 is then inverted by a reverse roller 35 and passed through an oven 26, which can contain heating coils, filaments, microwave sources, light or other sources operative for drying the vermiculite. Line speed may be 6 feet per minute or more. The temperature of the oven 26 or heat source is critical in that the maximum temperature of the film should not exceed 185°±5° Fahrenheit to minimize blistering. The film 12 should be dried by the time the film/carrier 12/14 is taken up on the rewind spool 28. The method of the invention may be accomplished on commercially available laminating/production coaters which are also known as "pilot coaters." One such machine is commercially available from Talboys of Windgap, Pa.

A film having a wet thickness of 6–8 mils, containing about 15% wt. or less of vermiculite is dried to a thickness of about 1 mil or less, using a #56 Meyer rod. A #22 Meyer rod is preferably used for the subsequent layers. Subsequent films are wet cast onto the preceding (dried) film layers in a wet thickness of about 4–6 mils, using the #22 Meyer rod, and after drying are about 0.75 mils thickness. Each wet-cast layer should be allowed to dry before successive ones are applied onto the carrier.

After drying, the vermiculite film is optionally pressrolled to increase smoothness of the film or calendered to ensure uniformity of thickness and to increase density.

. Press-rolling may be done by running the vermiculite/carrier through the nip between a steel cylinder and fabric covered roller, the vermiculite film being disposed against the steel cylinder. The vermiculite platelets, which have a "sandy feel" to the hand on the dried film, are believed to be squeezed down to obtain a smoother feel to the hand. Calendering is done using two steel cylinders. Preferably, calendering is done at 500 or more pounds per lineal inch of nip. A dried vermiculite film of about 4 mils total thickness, upon calendering at ambient temperature, decreases by about 1 mil in thickness. Both press-rolling and then calendering are preferably done prior to separating the vermiculite paper from the flexible carrier.

Once dried, the vermiculite film 10 and flexible carrier 12 can be separated. The dried vermiculite film is preferably separated from the carrier by peeling the carrier away from the film at an obtuse angle (greater than 90°) while the film is kept relatively flat. This facilitates the ease of separating the film from the carrier while minimizing the risk of subjecting the film to forces which may tear it.

In further exemplary methods, the separated vermiculite film can be subsequently disposed against or between siliconized or waxed sheets that may be used to support the film and protect it from the rigors of packaging or processing while providing a carrier with very easy release. For example, a siliconized paper may be applied to the separated film, and this release paper/film combination can be subjected to further processing such as coating, cutting, trimming, or patterning, prior to application of the film.

Figure 2:
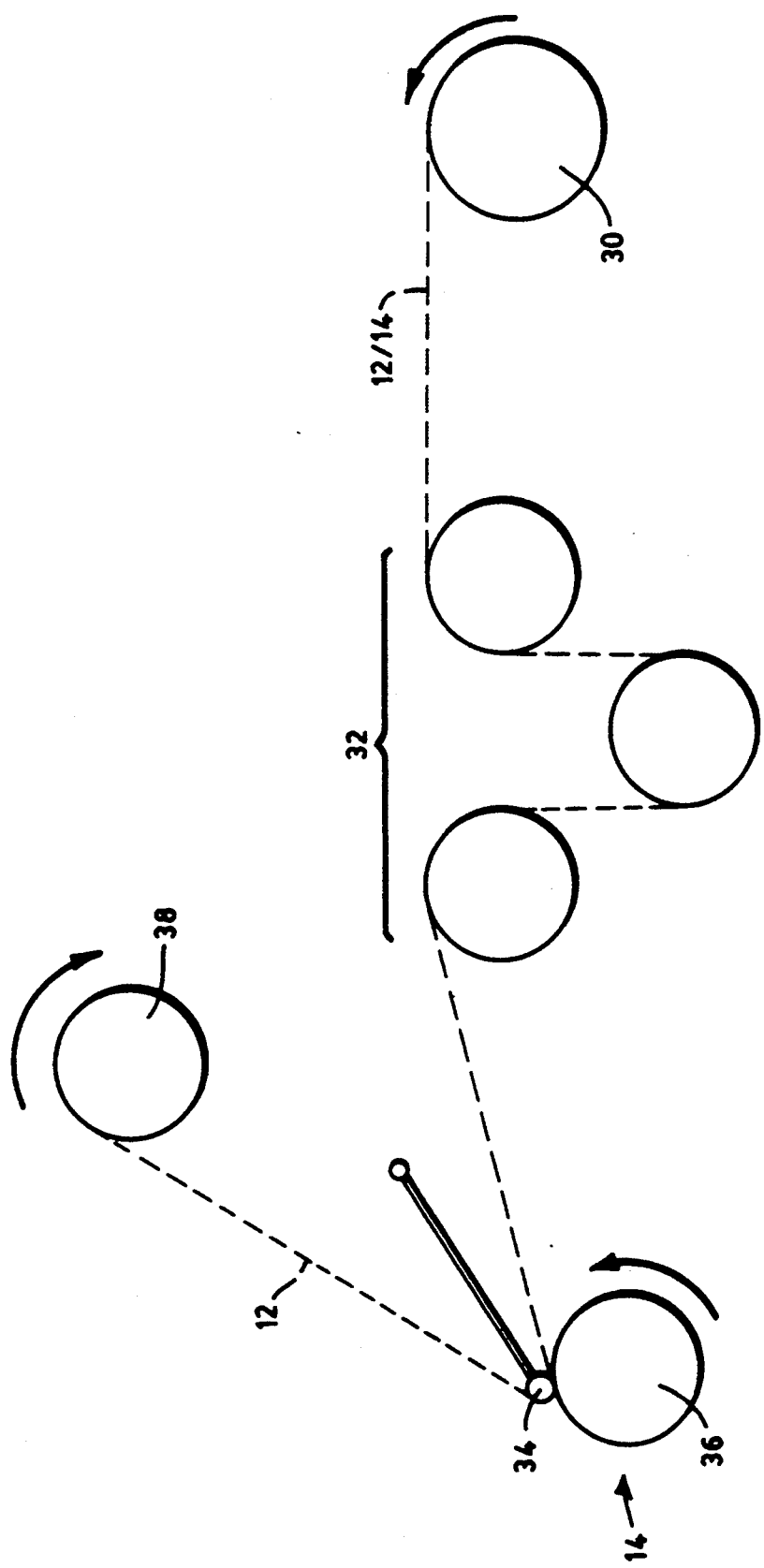
FIG. 2 is a diagrammatic illustration of an exemplary flexible carrier-supported releasable vermiculite film of the invention, and more particularly an exemplary method of the invention wherein an exemplary release carrier is removed continuously from a vermiculite film.
Figure 3:
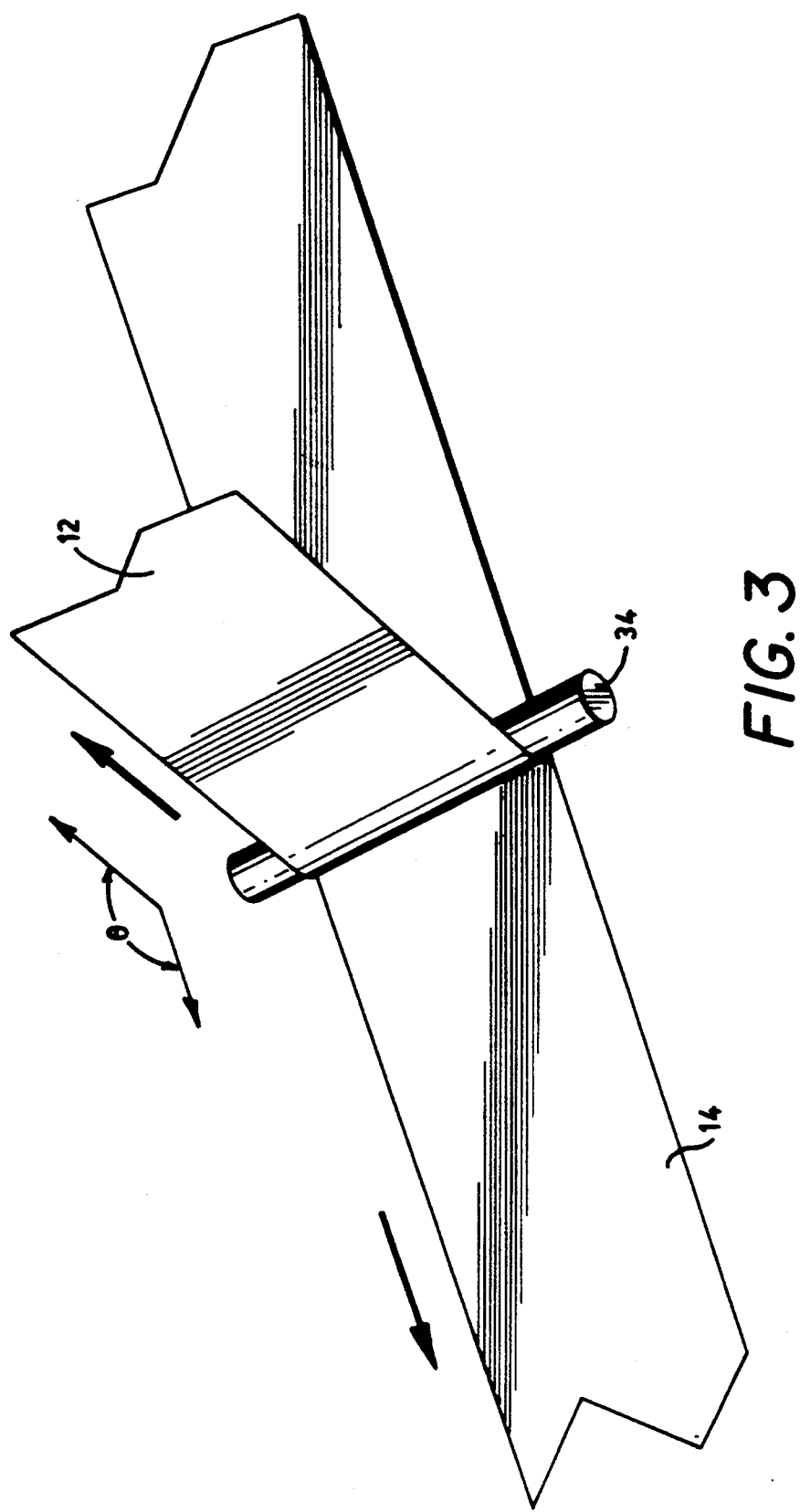
FIG. 3 is a enlarged partial perspective view of the method illustrated in FIG. 2.

FIG. 2 illustrates a further exemplary method of the invention wherein the release carrier 12 is continuously removed from dried vermiculite film 14. The film/carrier 12/14 is continuously pulled off the unwind roller 30, then preferably moved through a tensioning unit 32, and thereafter separated by removing the carrier, such as by using a ¼–⅜ inch steel rod 34, from the vermiculite film 14, which is taken up on a spool 36. The carrier 12 is then taken up on a separate spool 38. FIG. 3 shows an enlarged view of the rod 34. The angle $\theta$ of peel at which the carrier 12 is removed from the film 14 should preferably exceed 90° to avoid tearing of the film. A highly obtuse ($\theta$) angle (e.g., 130°) is preferred because the peel force is directed away from the film and is less likely to tear it.

In a further embodiment of the invention, the dried vermiculite film may be separated from the carrier by applying an adhesive, such as a pressure-sensitive adhesive or a glue, onto the dried film and/or to a substrate such as a wall, panel, or other object, applying the film onto the substrate, and removing the carrier so that the film remains adhered to the substrate.

A number of polymeric binders may be added to the vermiculite dispersion 10 to provide strength and water resistance in the resultant vermiculite film. Polyvinyl chloride (PVC) is a preferred binder suitable for flame retardancy. GEON ® 577, a plasticized PVC, and GEON ® 352 (X21), an unplasticized PVC, both available from B. F. Goodrich, may be used in equal parts to constitute 10% by weight of total dry solids in an exemplary nonflocculated vermiculite dispersion 10.

In further embodiments of the invention, an aziridine may be incorporated into the nonflocculated vermiculite dispersion 10 to increase water resistance of the resultant dried vermiculite film. Although binders have been used for mechanical reinforcement between fibers or layers, it is believed that the use of an aziridine has neither been previously taught nor suggested for use in vermiculite materials. Aziridines are believed to be compatible with the nonflocculated vermiculite dispersions disclosed herein because they do not cause coagulation or agglomeration of the dispersions.

Aziridines are compounds based on the following structure

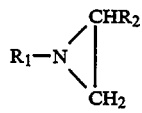

wherein the two carbons and nitrogen form a ring, and wherein $R_1$ and/or $R_2$ may include a hydrogen, an alkyl group comprising one or more carbons, or a carboxyl group. In the dried vermiculite product, it is believed that NCC ring opens up to form an amine linkage with other NCC ring constituents. $R_1$ and/or $R_2$ may also include polyfunctional groups.

Preferred aziridines for use in exemplary compositions include trimethylol-propane-tris-(B-(N-aziridinyl)-propionate) having the formula

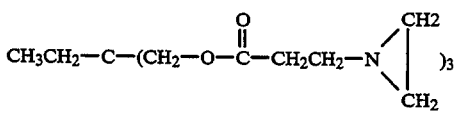

and pentaerythritol-tris-(B-(N-aziridinyl)propionate) having the formula

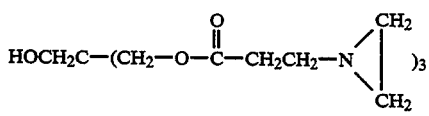

Aziridines which are suitable for use in the exemplary methods, films, and compositions of the invention are available from Hoechst Celanese under the tradenames XAMA TM -2 and XAMA TM -7. These are commercial forms of the preferred formulations shown above. Such polyfunctional aziridines are used as low temperature cross-linkers (such that cross-linking can occur at the temperatures necessary to remove water by heating) and adhesion promoters which impart flexibility, water resistance, and abrasion resistance.

The present invention is thus also directed to a composition comprising delaminated vermiculite lamellae and an aziridine. As it is believed that the aziridine forms an amine, the invention also pertains to a composition or film comprising vermiculite and a cross-linked amine formed from an aziridine. The composition may be used for making vermiculite products such as papers, films, solid articles, laminates, foams, coatings, and the like. The incorporation of an aziridine, which is believed to form an amine in the final product, provides water resistance while avoiding the use of chlorinated materials such as PVC.

Although the use of amines, ammonias or ureas in combination with vermiculite is known for providing water resistance properties, it is believed that the use of an aziridine in combination with an unflocculated vermiculite dispersion is indeed novel, because an aziridine can be incorporated at lower levels to provide a film with sufficient flexibility (e.g., rollability without breakage) and water resistance. Preferably, an aziridine can comprise less than 10% by dry weight of total solids in the vermiculite dispersion or mixture. More preferably, the aziridine can comprise 1–5% by dry weight of total solids, a range that is believed to provide a satisfactory combination of flexibility and water resistance. Below 1%, the contribution of the aziridine to the flame retardancy of the resultant vermiculite film is believed to be minimal; above 10%, the resultant film is too brittle such that it easily cracks when bent.

One of the purposes, fulfilled by the vermiculite film resulting from the use of an aziridine in the preferred range of 2–5% (based on dry weight of total solids) in the vermiculite dispersion, is that the film can be adhered onto curved or sharp surfaces which would required the dry vermiculite film to be bent or conformed without tearing or breaking. Moreover, the vermiculite film could also be attached or adhered to flexible or elastomeric products, such as gaskets made of materials such as silicone rubber, and be flexible enough to conform thereto without breaking or cracking.

The following examples are given for illustrative purposes only, and are not intended to be a limitation on the present invention, as defined by the appended claims. All percentages of components are based on dry weight of total solids in the dispersion unless otherwise noted.

EXAMPLE I

A vermiculite dispersion mixture comprising MicroLite ® HTS was adjusted by the addition of deionized water to a total (dry) solids content of approximately 14% and placed into the reservoir tray of a pilot coater. The deionized water was added to adjust viscosity such that a wet vermiculite film of about 6 mils thickness was retained on the surface of a flexible carrier, which comprised a paper tape backing coated with a release agent (commercially available under tradename Endura "PRT TM "). The carrier was drawn horizontally over a kiss roller which continuously applied a wet vermiculite film from the reservoir onto the underside of the release-agent-covered surface of the moving flexible carrier. The wet-film-covered underside surface of the moving carrier was then drawn over a #56 Meyer rod to provide a uniform wet film thickness of about 6–8 mils, then the film/carrier was reverse-rolled so that the wet film was on top. The film and carrier were then continuously moved through an oven at 170°–180°±5° F. at about six feet per minute to dry the film. The oven was approximately 13 feet long. The drying process, therefore, was only about two minutes. The film/carrier was rolled up onto a take-up cylinder. The dried vermiculite film was substantially blister-free because only a few pinhead-sized blisters were visible for every square foot or so of dried film. Most blisters could be eradicated by calendering the film/carrier at 500–700 lbs lineal inch ("PLI") nip at room temperature. The dried vermiculite film was about 1 mil thick and could be separated from the carrier sheet by carefully peeling the carrier sheet away from the dried film.

EXAMPLE II

Further layers were formed upon the 1 mil dried vermiculite film of the previous example. Three subsequent vermiculite layers about 4–6 mils wet thickness each were applied, and dried, upon the first layer. A #26 Meyer rod was used for these subsequent passes to achieve the 4–6 mils wet film thickness. A total of about 4 mils dried film thickness was obtained, which was reduced to about 3.0–3.5 mils after calendering at 500–700 pounds per lineal inch of nip at room temperature. The carrier could be easily peeled from the dry film by hand without tearing. The carrier could also be continuously removed by using a ¼" steel rod disposed on the side of the carrier opposite the film side.

EXAMPLE III

A dispersion, comprising vermiculite (MicroLite® HTS) (80%), plasticized PVC (10%), unplasticized PVC (10%), all percentages based on dry weight of total solids, and a small amount of deionized water to adjust viscosity, was placed in the tray of the pilot coater. The dispersion was adjusted to about 14% by weight solids. A wet vermiculite film of 6–8 mils was continuously laid, using a #56 Meyer rod, and dried continuously in the pilot coater oven. Three more films were successively wet-cast and dried thereon to obtain a cumulative thickness of about 4 mils. No large blisters were observed. Any pinhead-sized blisters, which were infrequent, could be eradicated by calendering at 500–700 pounds per lineal inch of nip at room temperature. The carrier peeled easily from the film, which was easy to handle.

EXAMPLE IV

A dispersion comprised vermiculite (98%) and an aziridine (2%) (available from Hoechst Celanese under the tradename XAMA ™-2). Percentages were based on dry weight of total solids in the dispersion. Viscosity was adjusted by deionized water. This formulation was placed in the reservoir tray of the pilot coater, and a film of about 4 mils thickness was created by sequential layering/drying onto the moving carrier. The dried film/carrier was calendered, and the vermiculite film released easily from the carrier. The film was placed into water at room temperature for 27 days, and did not dissolve or soften.

EXAMPLE V

The previous example was repeated, using another formulation of an aziridine (XAMA ™-7). Similar results were obtained as in the previous example.

EXAMPLE VI

A Kraft paper (50 lbs per ream) was calendered four times at 1,000–1,200 pounds per lineal inch of nip. A wet layer of DAREX® 409L was applied as a latex/release agent coating using a #22 Meyer rod on the pilot coater, and dried at about 170° F. Four vermiculite film layers were successively wet cast and dried. The vermiculite film was substantially blister-free, and released without tearing.

As modifications of the foregoing embodiments may be evident to those skilled in the art, the scope of the invention is limited only by the appended claims.

I claim:

1. A method for forming a vermiculite film, comprising the steps of:
   (a) providing a non-flocculated colloidal dispersion of delaminated vermiculite platelets, whereby a moving carrier can be coated with said dispersion on a continuous basis;
   (b) providing on a continuous basis a flexible carrier having wet vermiculite film retentiveness and dried vermiculite film releasability, said carrier being comprised of paper, said paper carrier comprising cellulose and said paper carrier being coated at least once with a coating layer comprising latex and a release agent, said coating layer being operative when dry to decrease the extent to which said vermiculite dispersion sinks into said paper;
   (c) applying a wet film of said dispersion to said carrier on a continuous basis; and
   (d) allowing said film to dry on said carrier, whereby a dried vermiculite film is continuously provided and is releasable from said carrier.

2. The method of claim 1 further comprising the step of drying said wet vermiculite film by applying heat at a temperature that does not exceed 185°±5° F. whereby substantial blistering in the dried film is minimized.

3. The method of claim 1 wherein said flexible carrier is used with at least one rotatable cylinder which allows continuous movement of said flexible carrier.

4. The method of claim 1 further comprising the step of separating dried vermiculite film from said flexible carrier.

5. The method of claim 4 wherein the step of separating dried vermiculite film from the carrier involves the additional steps of providing a substrate, providing an adhesive between said substrate and said dried vermiculite film, applying said film onto said substrate, and removing the carrier, whereby said film is separated from said carrier and is adhered to the substrate.

6. The method of claim 4 wherein the step of separating dried vermiculite film involves peeling said flexible carrier in a continuous fashion from said dry film while said film is substantially flat.

7. The method of claim 1 wherein said latex coating comprises acrylonitrile butadiene styrene.

8. The method of claim 1 wherein said carrier is latex-saturated and latex-coated.

9. The method of claim 1 wherein said dispersion further comprises a release agent.

10. The method of claim 1 wherein said release agent coated upon said carrier comprises an acrylonitrile acrylic copolymer.

11. The method of claim 1 wherein said release agent comprises a surface conditioning material comprising a surfactant, wax, silicone, oil, resin, polymer, or other abherent material operative to increase the releasability of said carrier.

12. The method of claim 1 further comprising the steps of applying at least one subsequent layer of wet vermiculite film onto a dried film on said carrier, and allowing said subsequent layer to dry.

13. The method of claim 1 further comprising the step of providing an aziridine in said nonflocculated dispersion of vermiculite platelets.

14. The method of claim 13 wherein the aziridine constitutes 10% of less based on dry weight of total solids in said dispersion.

15. The method of claim 14 wherein the aziridine constitutes 2–5% based on dry weight of total solids in said dispersion.

16. The method of claim 1 further comprising the step of rolling a cylinder across said vermiculite film after it is dried.

17. The method of claim 1 further comprising the step of providing a binder in said dispersion.

18. The method of claim 4 further comprising the step of disposing said separated dried vermiculite film against a subsequent release sheet.

19. The method of claim 1 wherein said wet vermiculite film is applied upon a moving flexible carrier at a wet thickness of about 7 mils or less.

20. A releasable coherent vermiculite film comprising delaminated non-flocculated vermiculite dried on a paper carrier provided in accordance with the method of claim 1, wherein said dried vermiculite film is releasably disposed on said paper carrier.

21. The method of claim 1 wherein said step of providing said carrier comprises the step of unrolling said carrier from a roll.

* * * * *